US010372174B2

(12) United States Patent
Baum et al.

(10) Patent No.: US 10,372,174 B2
(45) Date of Patent: Aug. 6, 2019

(54) CABLE MANAGEMENT ASSEMBLIES FOR ELECTRONIC APPLIANCES

(71) Applicant: Gigamon Inc., Santa Clara, CA (US)

(72) Inventors: Henry Baum, Livermore, CA (US); Ravichandran Venkatachalam, Bangalore (IN)

(73) Assignee: Gigamon Inc., Santa Clara, CA (US)

( * ) Notice: Subject to any disclaimer, the term of this patent is extended or adjusted under 35 U.S.C. 154(b) by 0 days.

(21) Appl. No.: 15/832,542

(22) Filed: Dec. 5, 2017

(65) Prior Publication Data
US 2019/0050030 A1 Feb. 14, 2019

Related U.S. Application Data

(60) Provisional application No. 62/545,085, filed on Aug. 14, 2017.

(51) Int. Cl.
*H05K 9/00* (2006.01)
*G06F 1/18* (2006.01)
*H05K 7/16* (2006.01)
*H05K 7/14* (2006.01)

(52) U.S. Cl.
CPC .............. *G06F 1/182* (2013.01); *G06F 1/189* (2013.01); *H05K 7/1487* (2013.01); *H05K 7/16* (2013.01); *H05K 9/002* (2013.01); *H05K 9/0062* (2013.01)

(58) Field of Classification Search
CPC .......... G06F 1/182; G06F 1/184; G06F 1/185; H05K 7/16; H05K 9/002; H05K 9/0062
USPC ................................. 361/825, 826, 816, 818
See application file for complete search history.

(56) References Cited

U.S. PATENT DOCUMENTS

| 5,834,693 | A | * | 11/1998 | Waddell | G06F 1/182 |
| | | | | | 174/657 |
| 6,175,079 | B1 | * | 1/2001 | Johnston | G02B 6/4452 |
| | | | | | 174/50 |
| 6,469,244 | B1 | * | 10/2002 | Harrison | H05K 9/0018 |
| | | | | | 174/360 |
| 9,425,544 | B2 | * | 8/2016 | Murakami | H01R 13/5213 |
| 2008/0080159 | A1 | * | 4/2008 | Sun | G06F 1/182 |
| | | | | | 361/818 |
| 2008/0175552 | A1 | * | 7/2008 | Smrha | G02B 6/4452 |
| | | | | | 385/135 |

(Continued)

*Primary Examiner* — Hung S. Bui
(74) *Attorney, Agent, or Firm* — Perkins Coie LLP

(57) ABSTRACT

A laminate curtain can suppress electromagnetic radiation leakage from an electronic appliance, as well as assist in managing cables interconnected to the electronic appliance. More specifically, a laminate curtain can include a conductive elastomer panel that absorbs spurious electromagnetic radiation generated by the electronic appliance, a conductive adhesive film disposed along one side of the conductive elastomer panel, and a conductive support frame affixed to the conductive adhesive film. The laminate curtain can be installed within a mounting frame, which secures the laminate curtain to the electronic appliance. Electromagnetic radiation that is absorbed by the conductive elastomer panel can travel to the electronic appliance via the conductive adhesive film, the conductive support frame, and the mounting frame. Thus, the conductive elastomer panel can be used to form a ground plane that catches and shunts the spurious electromagnetic radiation to the electronic appliance, which is grounded.

17 Claims, 14 Drawing Sheets

(56) References Cited

U.S. PATENT DOCUMENTS

2014/0345238 A1* 11/2014 Jun .................... H05K 7/20718
      55/385.4
2015/0077935 A1* 3/2015 Wright ............... H05K 7/20181
      361/695

* cited by examiner

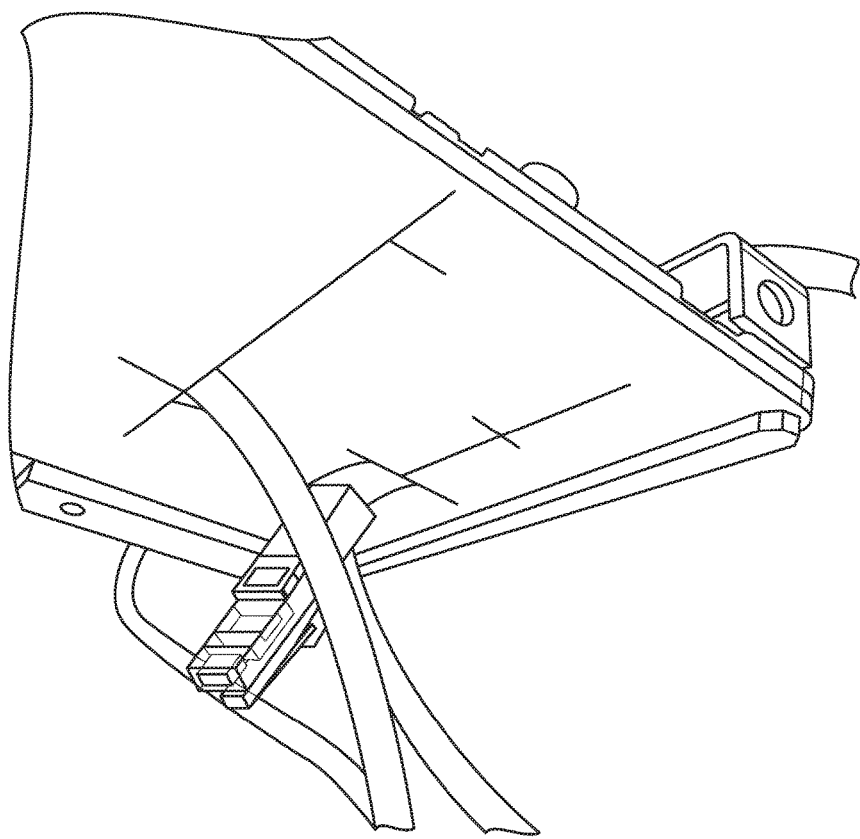

1300

1301
Acquire a conductive elastomer panel configured to absorb electromagnetic radiation 1302
Secure the conductive elastomer panel to a support frame 1303
Affix stiffener component(s) to exposed portion of conductive adhesive film 1304
Affix radiation-absorbing panel(s) to the conductive elastomer panel 1305
Cure laminate curtain for a specified duration 1306
Cut the laminate curtain to create an opening through which a cable can be guided

FIGURE 13

CABLE MANAGEMENT ASSEMBLIES FOR ELECTRONIC APPLIANCES

CROSS-REFERENCE TO RELATED APPLICATIONS

This application claims priority to U.S. Provisional Patent Application No. 62/545,085 titled "Cable Management Assemblies Having Side Curtains For Network Communication Systems" and filed on Aug. 14, 2017, which is incorporated by reference herein in its entirety.

FIELD OF THE INVENTION

At least one embodiment of the present disclosure pertains to assemblies for managing cables connected to an electronic appliance and suppressing electromagnetic radiation leakage from the electronic appliance.

BACKGROUND

Electromagnetic interference (EMI) is a disturbance that affects electrical components (e.g., integrated circuits) by electromagnetic induction, electrostatic coupling, or conduction. At high levels, EMI may degrade the performance of electrical components or prevent electrical components from functioning entirely. Man-made sources and natural sources can generate the changing electrical currents and voltages that cause EMI. Example of man-made sources include computer servers and other networking devices configured to filter, manipulate, and/or route traffic traversing a computer network.

Electromagnetic (EM) shielding is the practice of surrounding an electronic component with a conductive or magnetic material to guard against incoming emissions and/or outgoing emissions of electromagnetic frequencies (EMF). A number of different materials are conventionally used for EM shielding. For example, wires may be surrounded by metallic foil that blocks errant EMI. As another example, audio speakers may include an inner metallic casing that blocks EMI produced by the internal drivers. These materials prevent the EMI from affecting other nearly electronics (e.g., a mobile phone, radio, or television).

Conventional EM shielding technologies are becoming less effective as data transfer speeds increase. In order to increase the data transfer speed of an electronic appliance, the transmission frequency must also increase. However, increases in transmission frequency can greatly elevate the electromagnetic radiation generated by the electronic appliance.

BRIEF DESCRIPTION OF THE DRAWINGS

One or more embodiments of the present invention are illustrated by way of example and not limitation in the figures of the accompanying drawings, in which like references may indicate similar elements.

FIG. 12 illustrates how the slots in a laminate curtain can form a series of flaps, which seal as much as possible to ensure maximum capture of electromagnetic radiation leaking from the electronic appliance.

FIG. 13 depicts a flow diagram of a process for manufacturing a laminate curtain able to suppress electromagnetic radiation leaking from the chassis of an electronic appliance.

DETAILED DESCRIPTION

Figure 1:
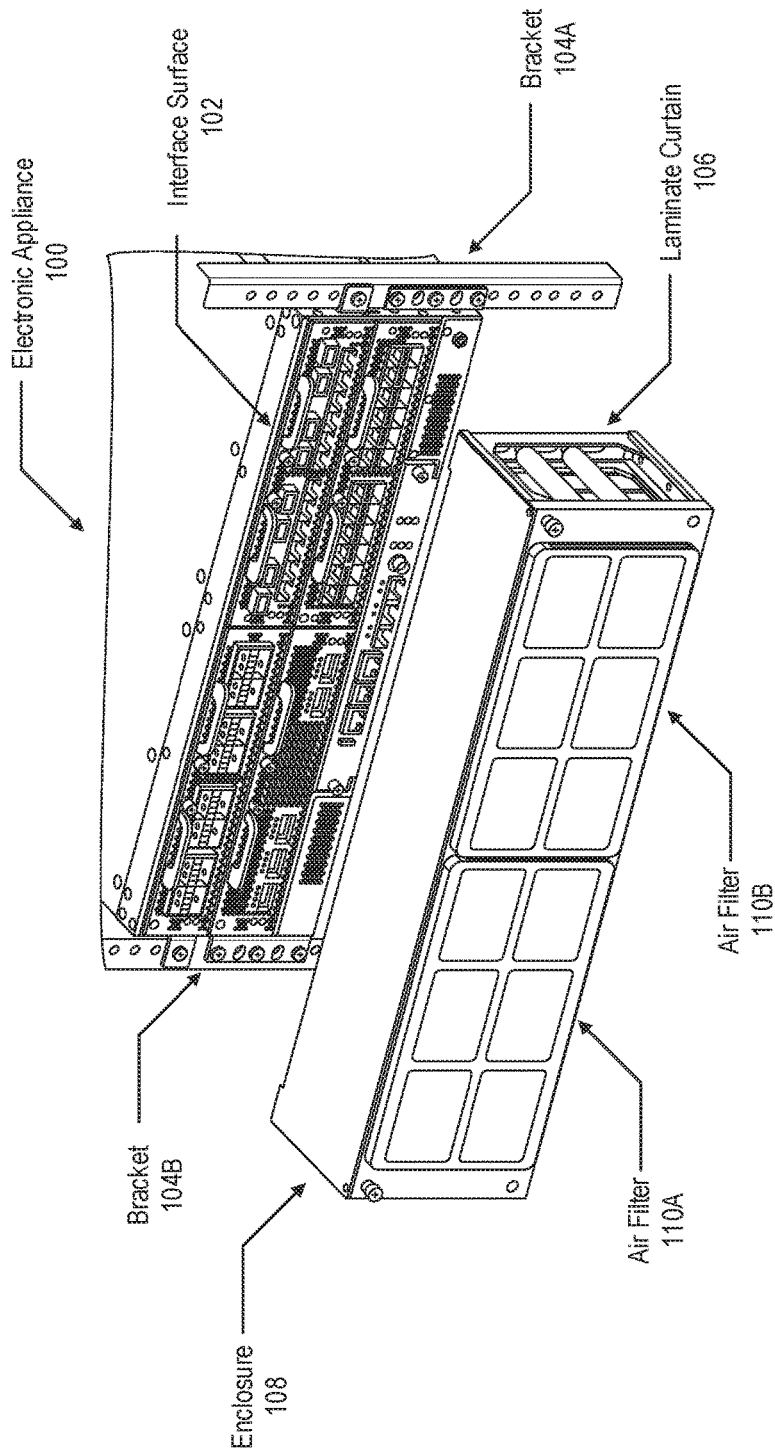
FIG. 1 depicts an example of an electronic appliance that is capable of receiving an enclosure that includes one or more laminate curtains.

Telecommunication and networking environments have become increasingly complex over the last decade. However, the basic design of the electronic appliances used in these environments has become fairly standardized.

For example, the chassis of an electronic appliance is typically designed such that the chassis can be installed in a rack following a well-developed set of standards defined by the International Electrotechnical Commission (IEC). An example of an electronic appliance is a computer server.

The front panel of such a chassis can include an interconnect interface (also referred to as an "interface surface") to which one or more cables can be connected. These cable(s) can include copper-based cables and/or fiber optic cables. Thus, when the chassis is installed in the rack, the front panel typically has cable(s) dressed horizontally to the left side and/or the right side of the chassis. The cable(s) can then be directed downward toward a cable trough below the floor or upward toward a cable runway above the rack.

Air is often guided through the chassis to cool the electronic appliance during operation. However, the air must be filtered to prevent the accumulation of dust, which can cause damage to the electronic appliance (e.g., by causing a fire). Chasses can be designed so that a chassis can be cooled using one or more fans positioned near the rear of the chassis. Such a design is referred to as a "front-to-back airflow model." The alternative design (i.e., the bottom-to-top airflow model) is less prevalent. While bottom-to-top airflow models do not experience the same airflow challenges as front-to-back airflow models, bottom-to-top airflow models can still experience similar issues regarding the leakage of electromagnetic radiation.

Electronic appliances must be able to meet several performance standards and requirements. For example, an electronic appliance may be required to conform to Federal Communication Commission (FCC) requirements for electromagnetic interference (EMI), radiation immunity, etc. EMI requirements ensure that the electronic appliance does not radiate excessive amounts of electromagnetic radiation that could adversely affect nearby electronic equipment, while radiation immunity requirements ensure that external radiation cannot enter the electronic appliance and interfere with performance.

In some instances, the electronic appliance will also need to comply with Telcordia Network Equipment-Building System (NEBS) guidelines. Compliance with NEBS guidelines is typically certified by an independent testing laboratory, such as National Technical Systems (NTS) or Underwriters Laboratories (UL). NEBS is a common set of guidelines applied to some types of electronic appliances (e.g., telecommunications equipment) to establish criteria for various operating environments and evaluate performance over a wide variety of conditions.

Meeting these various requirements can be difficult, so designers and manufacturers of electronic appliances must execute at a high level to achieve a passing result. Several factors have made passing results more difficult to achieve in the last several years. For example, as the data transfer speed of an electronic appliance increases, the transmission frequency will also increase. Consequently, an increase in data transfer speed will be accompanied by a proportional decrease in the wavelength of electromagnetic radiation generated by the electronic appliance. Because shorter wavelengths can more easily escape openings in a chassis, high-speed electronic appliances are more likely to experience electromagnetic radiation leakage.

Although completely-sealed chasses can prevent such leakage, completely-sealed chasses suffer from several additional issues. For example, a completely-sealed chassis will prevent air necessary for cooling from flowing through the electronic appliance. Moreover, the completely-sealed chassis will prevent the electronic appliance from being maintained and/or upgraded over the course of its lifetime through the implementation of replaceable components.

Consequently, developing an electronic appliance design that can achieve a passing result usually requires a combination of different solutions. Some of these solutions are based on containing electromagnetic radiation within the electronic appliance, and thus tend to involve complicated shielding and gasketing techniques that ensure the electronic appliance operates within the allowable limits.

Because new electronic appliances often operate at the edge of these allowable limits, a small margin is available to compensate for variation in electronic appliances. Examples of variations include variations in manufacturing, chassis design (e.g., the number of connectors along the front panel), signal strength (e.g., due to the actual signals being processed), data transfer speed, etc. For example, if an end user causes a 100-gigabit electronic appliance to subsequently become a 1,000-gigabit electronic appliance by replacing one or more plug-in modules, then the 1,000-gigabit electronic appliance is unlikely to still operate within the allowable limits.

Introduced here, therefore, are laminate curtain assemblies that suppress electromagnetic radiation leakage from an electronic appliance. The laminate curtain assembles can also block air from circumventing air filter(s) disposed along a side of the electronic appliance, thereby ensuring that the air must pass through the air filter(s) before entering the electronic appliance. The laminate curtain assemblies can also assist in managing cables interconnected to the electronic appliance.

More specifically, a laminate curtain can include a conductive elastomer panel that absorbs spurious electromagnetic radiation generated by the electronic appliance, a conductive adhesive film disposed along one side of the conductive elastomer panel, and a conductive support frame affixed to the conductive adhesive film. The laminate curtain can be installed within a mounting frame, which secures the laminate curtain to the electronic appliance. Electromagnetic radiation that is absorbed by the conductive elastomer panel can travel to the electronic appliance via the conductive adhesive film, the conductive support frame, and the mounting frame. The conductive elastomer panel can be used to form a ground plane that catches and shunts the spurious electromagnetic radiation to the electronic appliance, which is grounded.

Terminology

Reference to "one embodiment" or "an embodiment" means that the particular feature, function, structure, or characteristic being described is included in at least one embodiment of the present disclosure. Occurrences of such phrases do not necessarily all refer to the same embodiment, nor are they necessarily referring to alternative embodiments that are mutually exclusive of one another.

The terms "connected," "coupled," or any variant thereof includes any connection or coupling between two or more elements, either direct or indirect. The coupling/connection can be physical, logical, or a combination thereof. For example, two devices may be physically, electrically, and/or communicatively coupled to one another.

General System Overview

FIG. 1 depicts an example of an electronic appliance 100 that is capable of receiving an enclosure 108 that includes one or more laminate curtains 106. As shown here, the enclosure 108 can be securely mounted to one or more brackets 104A-B disposed along opposing sides of the electronic appliance 100. The bracket(s) 104A-B may also be referred to as "vertical chassis mounting rails" or simply "chassis mounting rails." The bracket(s) 104A-B can be affixed to the chassis of the electronic appliance 100 or a rack within which the electronic appliance 100 is mounted.

Cables typically tend to be connected to the electronic appliance 100 through the use of connectors disposed along the front panel or the rear panel of the electronic appliance 100. Here, for example, the electronic appliance 100 includes multiple connectors arranged along an interface surface 102. This allows for great flexibility in making the necessary connections from a variety of interconnection types. For example, copper-based cables for power, control, and/or signaling can be interconnected to electrical connectors along the interface surface 102. Additionally or alternatively, fiber optic cables may be interconnected to optical connectors along the interface surface 102. Each electrical connector and optical connector along the interface surface 102 corresponds to an opening in the chassis of the electronic appliance 100 through which electromagnetic radiation can escape.

The electrical appliance 100 may also be cooled during operation. Thus, one or more openings may be created along the air inlet side(s) and the air outlet side(s) of the electrical appliance 100, thereby effectively creating a duct for cooling. For example, a fan disposed near the rear of the electronic appliance 100 may be arranged to draw air in through opening(s) along the interface surface 102 and expel the air through opening(s) along the rear panel of the chassis. The opening(s) may be designed to maximize the availability of air and limit leakage of electromagnetic radiation. For example, the size and/or number of openings may be limited to ensure proper attenuation of electromagnetic radiation. As another example, an EMI suppression panel may at least partially overlap an opening to prevent electromagnetic radiation from leaking through the opening.

Containment of electromagnetic radiation can become more complicated when the interconnection(s) between the electronic appliance 100 and other pieces of electronic equipment are addressed. Many electronic appliances not only require a large number of connectors (e.g., along the interface surface 102), but also as many openings for ventilation as can be provided. Powerful fans may be required to move air through the limited ventilation area in the electronic appliance 100. Generally, air is circulated through the electronic appliance 100 on the order of hundreds of cubic feet per minute.

Cables connected to the interface surface 102 must also be managed so that the cables themselves do not become a hindrance to air flow. The laminate curtain(s) 106 may aid in guiding any cables connected to the interface surface 102 of the electronic appliance 100 into a vertical channel positioned alongside the electronic appliance 100. For example, a cable may extend through a perforation in a laminate curtain 106. Generally, vertical channels are created between adjacent racks that each include one or more electronic appliances.

The enclosure 108 can include a top panel, a bottom panel, and a front panel that connects the top panel to the bottom panel. The laminate curtain(s) 106, meanwhile, may be arranged along opposing ends of the enclosure 108. Together, the laminate curtain(s) 106 and the enclosure 108 may form a substantially-sealed chamber adjacent to the interface surface 102 of the electronic appliance 100. In some embodiments, a single laminate curtain 106 is disposed at one end of the enclosure 108, while a side panel is disposed at the opposite end of the enclosure 108. The side panel may ensure that one end of the enclosure is completely sealed.

The enclosure 108 may also include one or more air filters 110A-B (also referred to as "air filtration panels") that are configured to filter air entering the electronic appliance 100. The air filter(s) 110A-B are generally disposed within the front panel of the enclosure 108 if the electronic appliance 100 is a front-to-back airflow mode. However, the air filter(s) 110A-B could also be disposed within the top panel or the bottom panel of the enclosure 108.

Thus, the entire three-dimensional (3D) space in front of the interface surface 102 of the electronic appliance 100 can be used for air filtration, electromagnetic radiation suppression, and cable management. The laminate curtain(s) 106 located within the cable transition region (CTR) are able to address each of these problems.

The CTR is where horizontally-directed cables that are connected to the interface surface 102 turn into the vertical channel positioned adjacent to the electronic appliance 100. Historically, the CTR has been poorly managed. For example, conventional electronic appliances may address air filtration but not electromagnetic radiation suppression, or vice versa. In fact, conventional electronic appliances typically allow unfiltered air to flow through the CTR, which permits unfiltered air to merge with filtered air flowing through the air filter(s). For the reasons noted above, such electronic appliances may still meet the minimum requirements imposed by the FCC, NEBS, etc.

Figure 2:
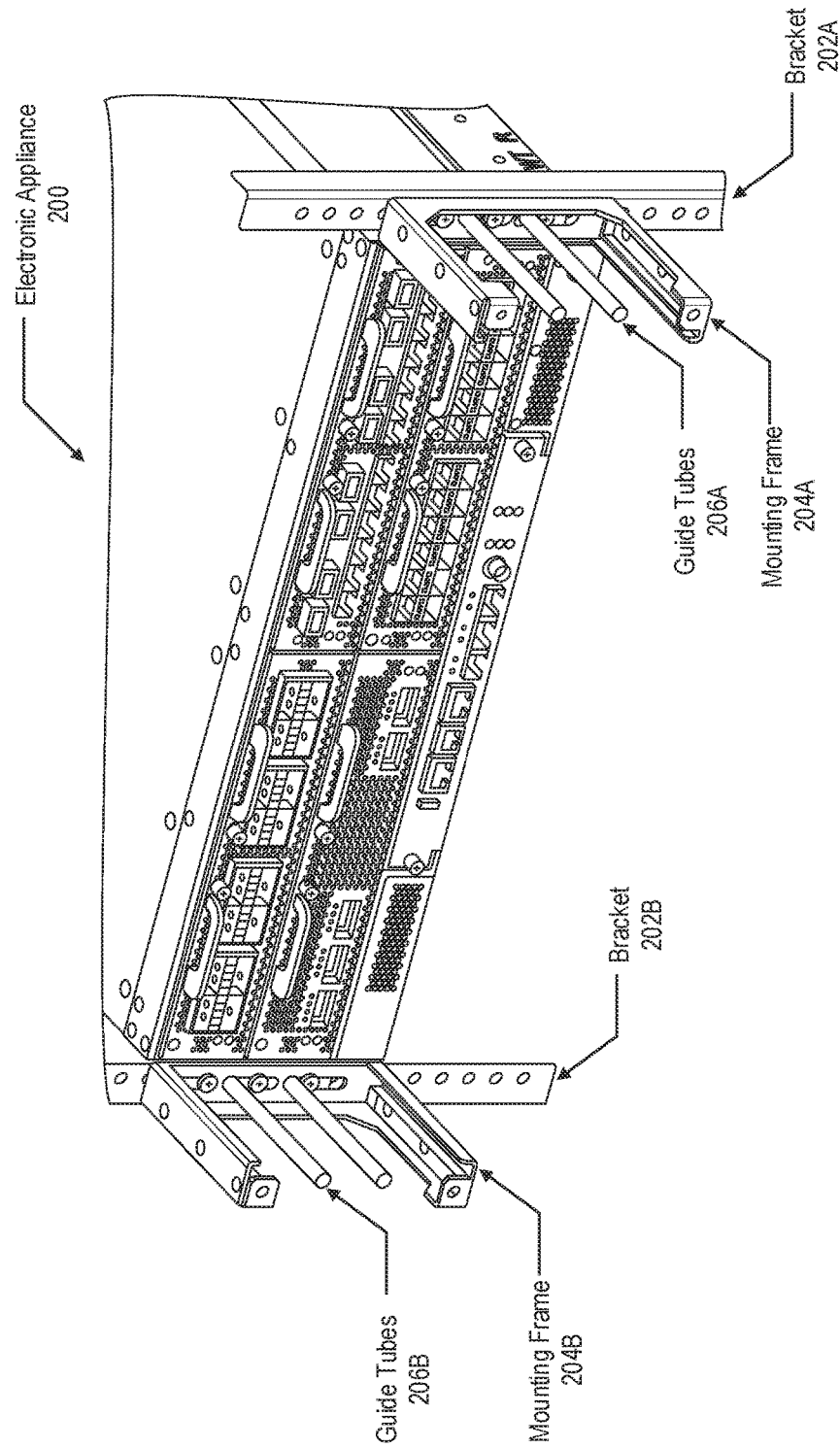
FIG. 2 depicts an example of an electronic appliance having brackets secured thereto.

FIG. 2 depicts an example of an electronic appliance 200 having brackets 202A-B secured thereto. The brackets 202A-B may be attached to opposing sides of the chassis of the electronic appliance 200 or the rack within which the electronic appliance 200 is mounted. The brackets 202A-B can be attached to the chassis of the electronic appliance 200 with nuts and bolts, screws, magnets, or some other conductive fastener.

Each bracket 202A-B can be designed to receive a mounting frame 204A-B. Here, the mounting frames 204A-B are empty. However, as further described below, the mounting frames 204A-B will generally include laminate curtains when the electronic appliance 200 is in operation. In some embodiments, the mounting frames 204A-B include one or more guide tubes 206A-B. The guide tube(s) 206A-B can permit a laminate curtain to be readily installed within the mounting frames 204A-B. For example, each laminate curtain may include collar(s) configured to slip over the guide tube(s) 206A-B. The guide tube(s) 206A-B can also support cables that are routed from the interface surface of the electronic appliance 200 toward a vertical channel positioned alongside the electronic appliance 200. Thus, the mounting frames 204A-B can assist in transitioning cables into the vertical channel.

The brackets 202A-B, the mounting frames 204A-B, and/or the guide tubes 206A-B can be comprised of a conductive material, such as metal, graphite, polymer(s), etc. For example, the mounting frames 204A-B and the guide tubes 206A-B may be comprised of aluminum. Additionally or alternatively, the brackets 202A-B, the mounting frames 204A-B, and/or the guide tubes 206A-B can include a conductive plating comprised of, for example, aluminum or copper. For example, the brackets 202A-B may be comprised of stainless steel but may include copper plating.

The brackets 202A-B, the mounting frames 204A-B, and the guide tubes 206A-B (collectively referred to as the "mounting components") can all be electrically conductive. Thus, the mounting components can be electrically connected to one another, as well as to the chassis of the electronic appliance 200 and/or the rack within which the electric appliance 200 is mounted. Such a design effectively grounds the mounting components.

Figure 3:
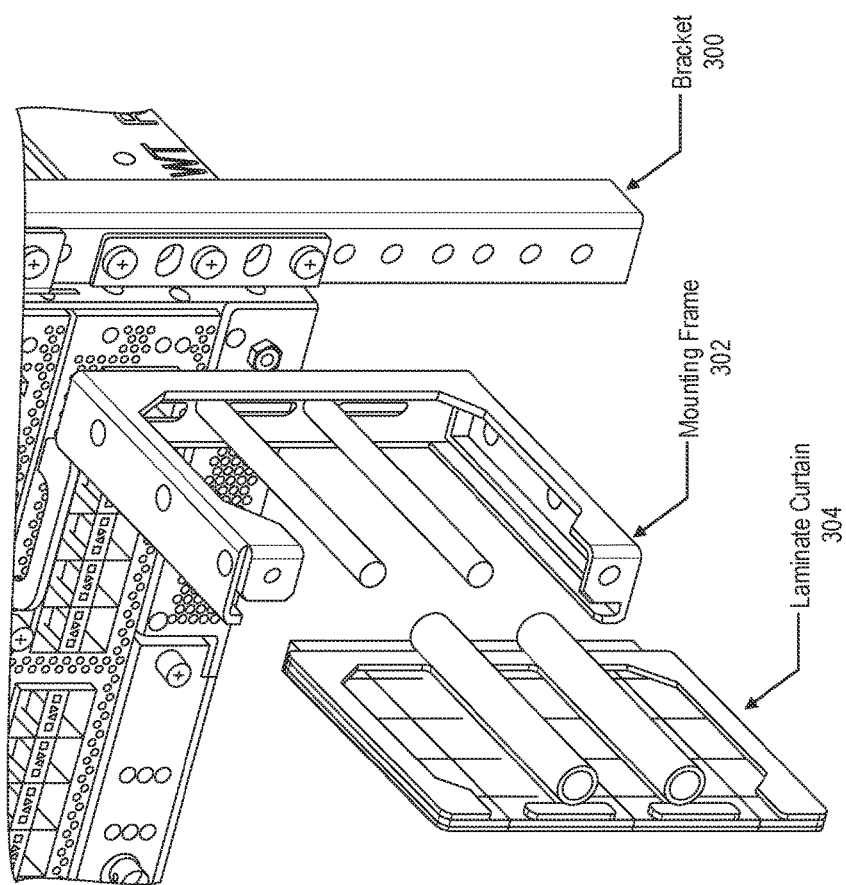
FIG. 3 depicts an example of a laminate curtain that can be installed within a mounting frame.

FIG. 3 depicts an example of a laminate curtain 304 that can be installed within a mounting frame 302. Similarly, the mounting frame 302 can be secured to a bracket 300 that is connected to the chassis of an electronic appliance. When the mounting frame 302 is affixed to the bracket 300, the mounting frame 302 will typically be arranged orthogonal to the interface surface of the electronic appliance.

As further described below, the laminate curtain 304 can include a conductive elastomer panel that absorbs spurious electromagnetic radiation generated by the electronic appliance, a conductive adhesive film disposed along one side of the conductive elastomer panel, and a conductive support frame affixed to the conductive adhesive film. The conductive support frame of the laminate curtain 304 can be detachably mounted to the mounting frame 302. Here, for example, the conductive support frame includes a pair of collars that can slip over the guide tubes of the mounting frame 302.

When electromagnetic radiation leaks through the interface surface of the electronic appliance, the laminate curtain 304 will absorb the electromagnetic radiation. Moreover, because the laminate curtain 304, the mounting frame 302, and the bracket 300 are all electrically conductive, the electromagnetic radiation can be safely shunted from the laminate curtain 304 to the chassis of the electronic appliance, which is grounded.

In some embodiments, the bracket 300 and/or the mounting frame 302 are painted for aesthetic reasons. Insulating the bracket 300 and/or the mounting frame 302 in such a manner may not have any impact on electrical conductivity.

Figure 4:
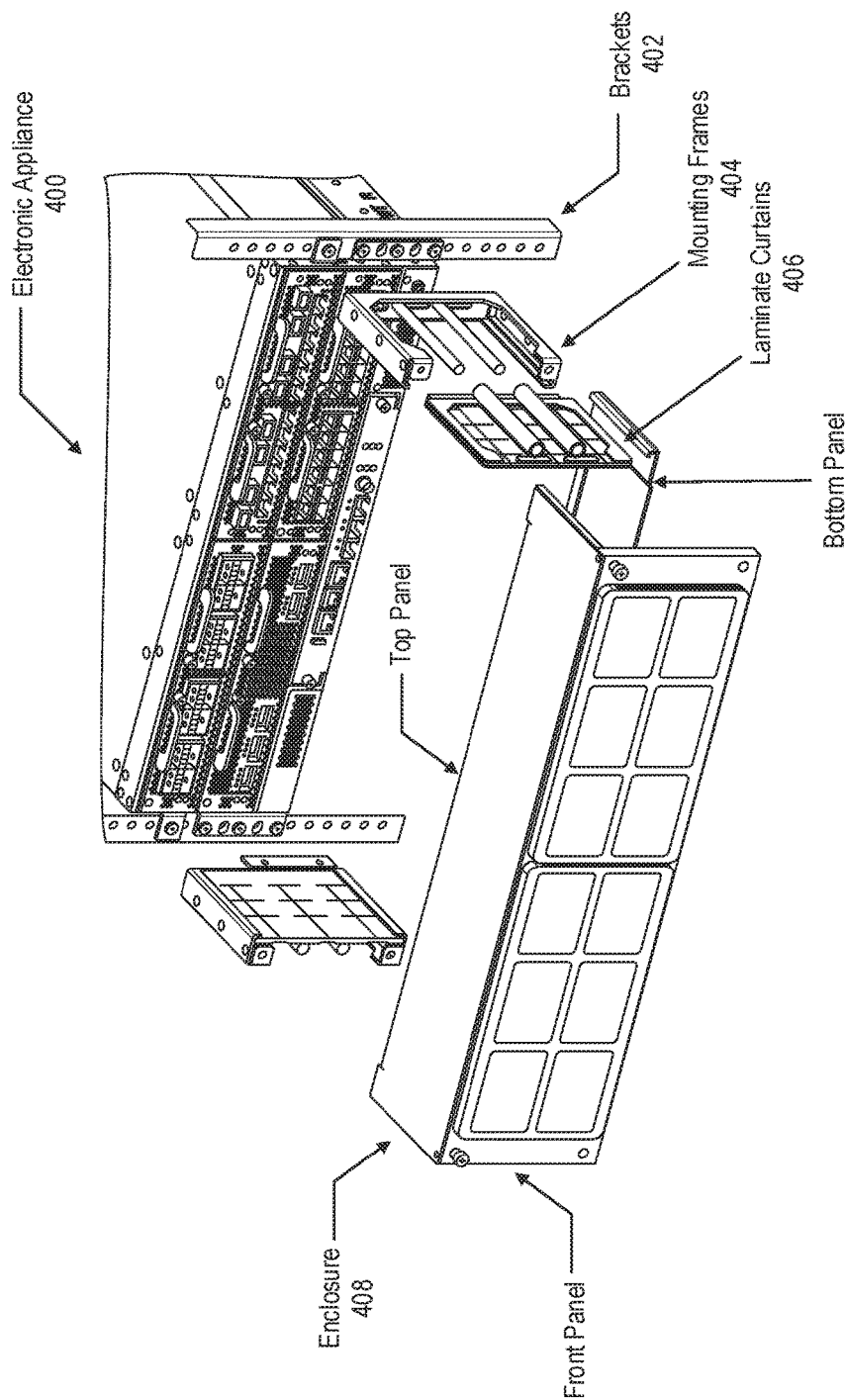
FIG. 4 depicts an exploded view of a cable management assembly that can be secured to an electronic appliance adjacent to the interface surface to which cables can be connected.

FIG. 4 depicts an exploded view of a cable management assembly that can be secured to an electronic appliance 400 adjacent to the interface surface to which cables can be connected. More specifically, the cable management assembly can include a pair of laminate curtains 406 that are installed within mounting frames 404, as well as an enclosure 408 that can be mounted to the mounting frames 404. The cable management assembly can be secured to brackets 402 attached to opposing sides of the chassis of the electronic appliance 400.

The enclosure 408 can include a bottom panel (also referred to as a "bottom plate") that prevents cables attached to the interface surface from drooping into the envelope of electronic equipment positioned below the electronic appliance 400. For example, a rack will often include multiple electronic appliances that are stacked on top of one another, so it is important that each electronic appliance only use the space adjacent to its own interface surface. The enclosure 408 can also include a top panel and/or a front panel that connects the top panel to the bottom panel.

When the enclosure 408 is mounted to the mounting frames 404, the enclosure 408 and the laminate curtains 406 will form a substantially-sealed chamber adjacent to the interface surface of the electronic appliance 400. This space may also be referred to as the "cabling space." The laminate curtains 406 installed within the mounting frames 404 can prevent unfiltered air from flowing into the cabling space, as well as prevent electromagnetic radiation leaking from the interface surface from escaping the cabling space. Thus, the technology introduced here is able to effectively manage EMI leakage and airflow through the CTR of the electronic appliance 400.

As noted above, NEBS may require that air be filtered prior to entering the electronic appliance 400. Conventionally, this requirement is often waived or achieved only by meeting the letter of the requirement, rather than by actually performing the task as defined by the requirement. Air filters can become a maintenance issue as air filters must be serviced (e.g., cleaned or replaced) at regular intervals. In some instances, a panel that includes an air filter may be attached to the front of an electronic appliance. However, the panel, which becomes an integral part of the electronic appliance during the certification process, represents an extremely large hole through which electromagnetic radiation can escape.

Figure 5:
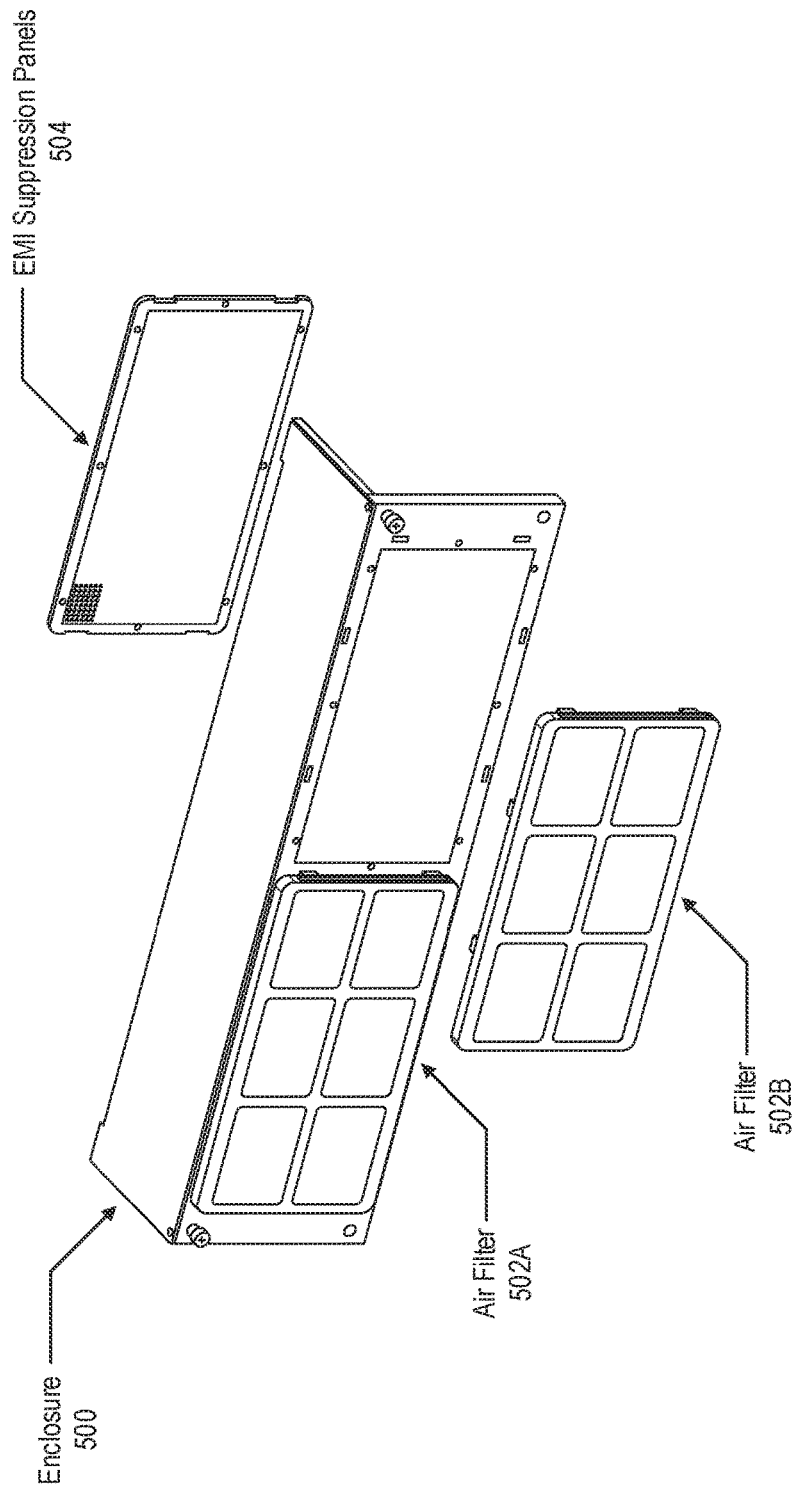
FIG. 5 depicts an example of an enclosure that includes multiple air filters and multiple EMI suppression panels.

FIG. 5 depicts an example of an enclosure 500 that includes multiple air filters 502A-B and multiple EMI suppression panels 504. While the enclosure 500 shown here includes multiple air filters and multiple EMI suppression panels, other embodiments could include a single air filter and/or a single EMI suppression panel. For example, some embodiments of the enclosure 500 include multiple air filters and a single EMI suppression panel that at least partially overlaps the multiple air filters.

The EMI suppression panels 504 may be arranged behind the air filter(s) 502A-B to further control electromagnetic radiation that has not otherwise been attenuated. Together with one or more laminate curtains, the EMI suppression panels 504 can ensure that an electronic appliance will meet the pertinent limits on electromagnetic radiation.

The enclosure 500 can also include air filter(s) 502A-B that ensure air entering the electronic appliance through the interface surface is filtered. The air filters 502A-B may be disposable air filters that are readily replaceable by an end user responsible for servicing the electronic appliance. In some embodiments, EMI suppression panels 504 are arranged behind the air filters 502A-B such that the EMI suppression panels 504 at least partially overlap the air panels 502A-B. The EMI suppression panels 504 may be, for example, suppression filters that provide electromagnetic noise suppression. Suppression filters can have different thicknesses, designs (e.g., honeycomb-shaped wells), etc., based on the characteristics of the electromagnetic radiation intended to be shielded. For example, if the data transfer speed of an electronic appliance increases, a designer may select a new suppression filter having a larger thickness, smaller honeycomb-shaped well size, etc.

Figure 6:
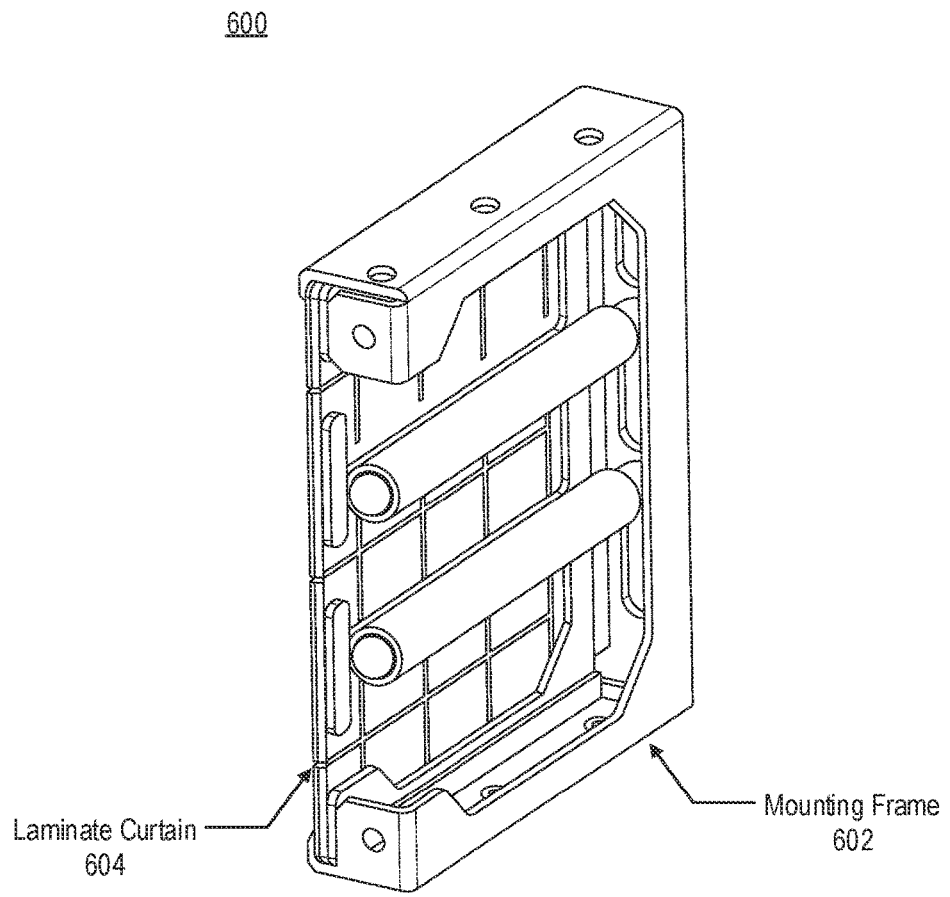
FIG. 6 depicts a laminate curtain installed within a mounting frame.
Figure 7:
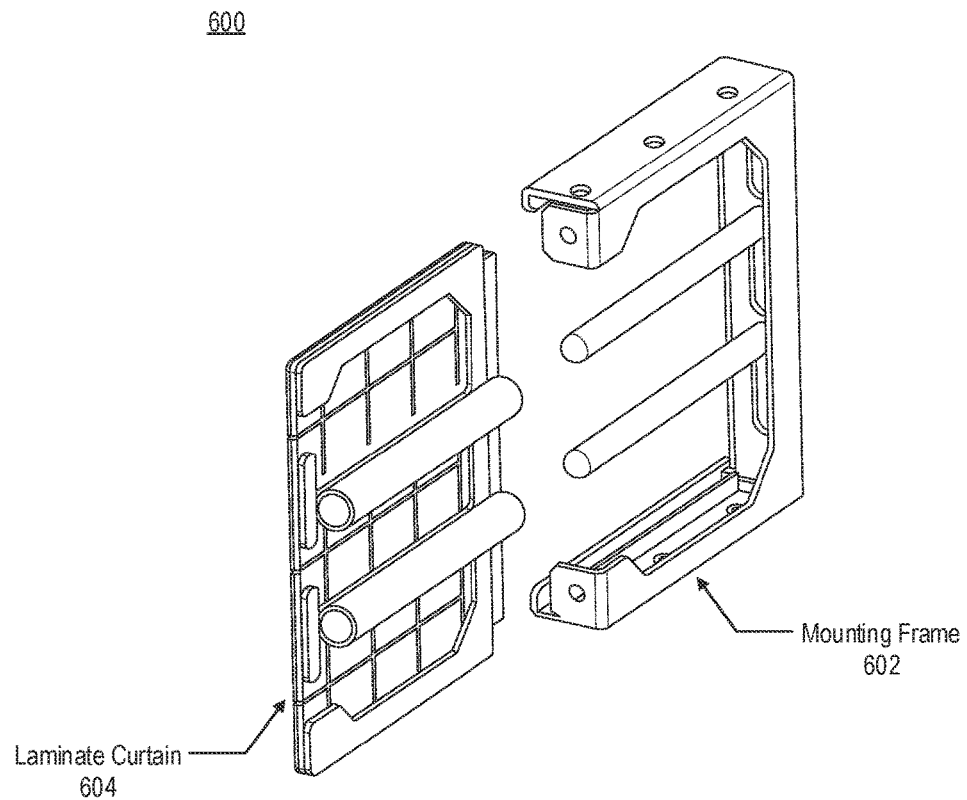
FIG. 7 depicts a front perspective view of the laminate curtain prior to installation within the mounting frame.
Figure 8:
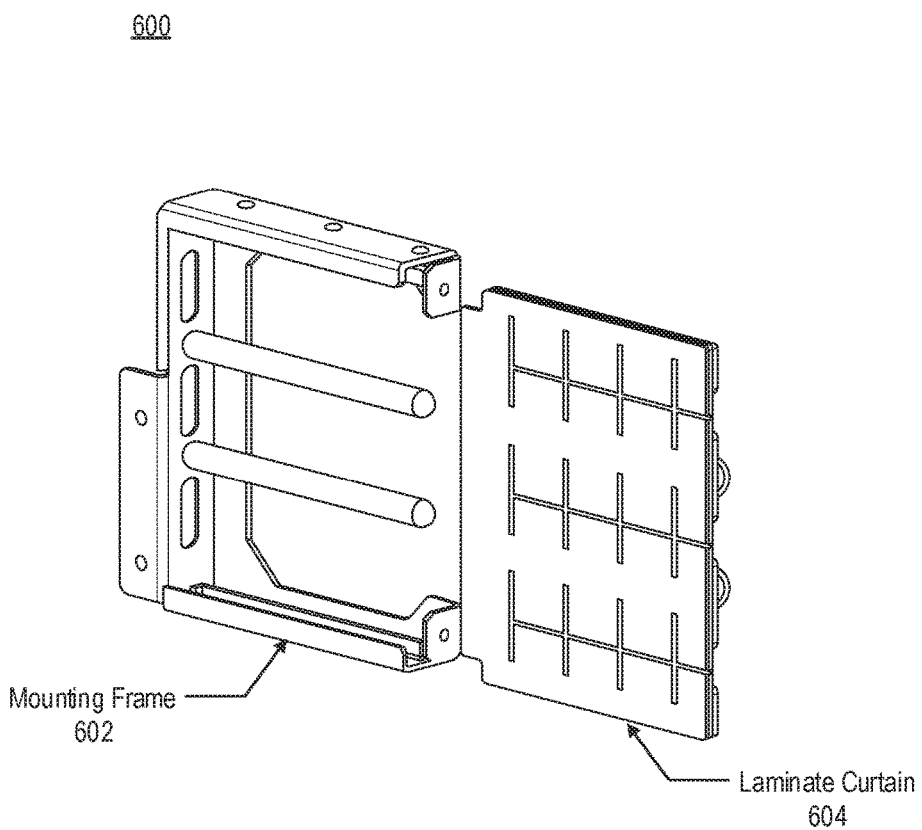
FIG. 8 depicts a rear perspective view of the laminate curtain prior to installation within the mounting frame.

FIGS. 6-8 depict several different views of a laminate curtain assembly 600. More specifically, FIG. 6 depicts a laminate curtain 604 installed within a mounting frame 602. FIG. 7 depicts a front perspective view of the laminate curtain 604 prior to installation within the mounting frame 602, while FIG. 8 depicts a rear perspective view of the laminate curtain 604 prior to installation within the mounting frame 602.

Laminate curtain assemblies may be used by themselves in some instances (i.e., without an enclosure having a top panel, bottom panel, and/or front panel). In such embodiments, a laminate curtain assembly may be used to guide airflow through an electronic appliance, suppress electromagnetic radiation leaking from the electronic appliance, etc.

In some embodiments, the laminate curtain 604 is fixedly installed within the mounting frame 602. Thus, in order to remove or replace a laminate curtain 604, an end user may be required to remove the mounting frame 602 as well.

In other embodiments, the laminate curtain 604 is readily removable from the mounting frame 602. Here, for example, the laminate curtain 604 includes a pair of collars that can slip over the guide tubes of the mounting frame 602. Consequently, the laminate curtain 604 could be replaced or upgraded as necessary. For example, if fewer cables are to be attached to the interface surface of a network appliance, then a new laminate curtain may be installed to avoid having electromagnetic radiation leak through openings in a laminate curtain that were previously filled by cables. As another example, if the data transfer speed of an electronic appliance increases, then a new laminate curtain designed to capture a different frequency range of electromagnetic radiation may be installed.

Figure 9:
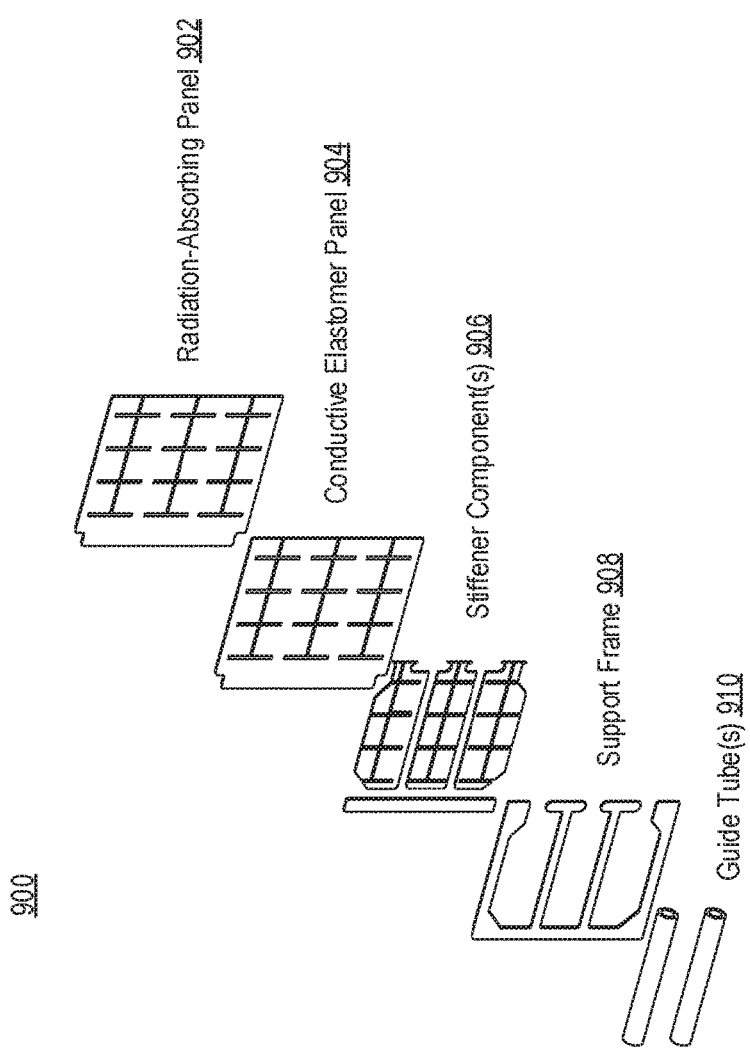
FIG. 9 depicts an example of a laminate curtain for suppressing electromagnetic radiation leaking from the chassis of an electronic appliance.

FIG. 9 depicts an example of a laminate curtain 900 for suppressing electromagnetic radiation leaking from the chassis of an electronic appliance. The laminate curtain 900 can include several layers that are responsible for performing different tasks.

For example, a conductive elastomer panel 904 can be configured to absorb spurious electromagnetic radiation generated by the electronic appliance. More specifically, the conductive elastomer panel 904 can form a ground plane that catches electromagnetic radiation leaking from the chassis of the electronic appliance, and then shunts the electromagnetic radiation to ground. Electrically-conductive elastomers can provide excellent mechanical and electromagnetic shielding properties, and electrically-conductive elastomers can be used in a wide range of operating temperatures. The conductive elastomer panel 904 may be comprised of a microwave absorber material in an extruded, molded, formed, or printed format. The conductive elastomer panel 904 is generally designed to perform over a large range of electromagnetic radiation frequencies. Conductive elastomer panels can be cut to different lengths, widths, and/or thicknesses based on the intended application (e.g., whether the laminate curtain will be used in conjunction with an enclosure). Conductive elastomer panels can also be designed to be fairly rigid. Performance of a conductive elastomer panel can vary based on the thickness, material formula, etc. Moreover, performance is typically optimized for a specified frequency range, and thus may fall off rapidly beyond the specified frequency range. Several examples of microwave absorber materials are provided in Table I.

TABLE I

Examples of microwave absorber materials.

| Material | Representative Frequency Range | Representative Thickness | Reflectivity Performance |
|---|---|---|---|
| Conductive Foam (e.g., Parker Soft-Shield 3500) | 20 MHz-10 GHz | 2 mm | >100 dB |
| Conductive Foam (e.g., Parker Soft-Shield 4850) | 20 MHz-10 GHz | 3 mm | >90 dB |
| Conductive Foam (e.g., Laird 5233) | 200 MHz-10 GHz | 3.2 mm | >90 dB |

The conductive elastomer panel 904 typically includes a conductive adhesive film that covers at least a portion of one surface. The conductive adhesive film may securely bond the conductive elastomer panel 904 to a support frame 908. The support frame 908 may be, for example, a laser-cut piece of sheet metal to which one or more guide tubes 910 have been welded to form a permanent, electrically-conductive attachment. In some embodiments the support frame 908 and the guide tubes 910 are comprised of an electrically-conductive material, while in other embodiments the support frame 908 and the guide tubes 910 are plated with an electrically-conductive finish.

The conductive adhesive film may extend across an entire side of the conductive elastomer panel 904. However, the support frame 908 may only make contact with a relatively small percentage of the conductive adhesive film. Any remaining exposed adhesive may be covered with one or more stiffener components 906. The stiffener component(s) 906 may be comprised of, for example, plastic, glass, rubber, etc. The stiffener component(s) 906 add stiffness to the laminated curtain 900. This may help keep the laminated curtain 900 relatively flat, especially when no cables are passing through.

In some embodiments, the laminate curtain 900 also includes a radiation-absorbing panel 902 configured to absorb electromagnetic radiation of a specified frequency. The radiation-absorbing panel 902 can be comprised of a material (also referred to as a "radiation-absorbent material") that is designed to absorb incident radiofrequency (RF) electromagnetic radiation as effectively as possible. Unlike the conductive elastomer panel 904, the radiation-absorbing panel 902 is typically engineered to perform optimally at a relatively narrow range of electromagnetic radiation frequencies. For example, a radiation-absorbing panel 902 may be designed to absorb electromagnetic radiation corresponding to a frequency of 97 gigahertz (GHz). However, a radiation-absorbing panel tuned to a particular frequency (e.g., 97 GHz) will not absorb the electromagnetic radiation of nearby frequencies (e.g., 95 GHz) very well, and will not absorb the electromagnetic radiation of distant frequencies (e.g., 87 GHz) at all. Performance of a radiation-absorbing panel 902 can vary based on the material formula. Moreover, performance is typically optimized for a center frequency, and thus may fall off rapidly on either side of the center frequency. Several examples of radiation-absorbing panel materials are provided in Table II.

TABLE II

Examples of radiation-absorbing panel materials.

| Material | Representative Frequency Range | Reflectivity Characteristic | Reflectivity Performance |
|---|---|---|---|
| Iron Carbonyl Sheet (e.g., Murata EA10) | 2 GHz-20 GHz | Wide Spectrum | >10 dB |
| Rubber Sheet (e.g., Cuming FLX-1.0, 2.0, etc.) | 2 GHz-18 GHz | Tuned Frequency Bands | ~20 dB at a specified tuned frequency |

Figure 10:
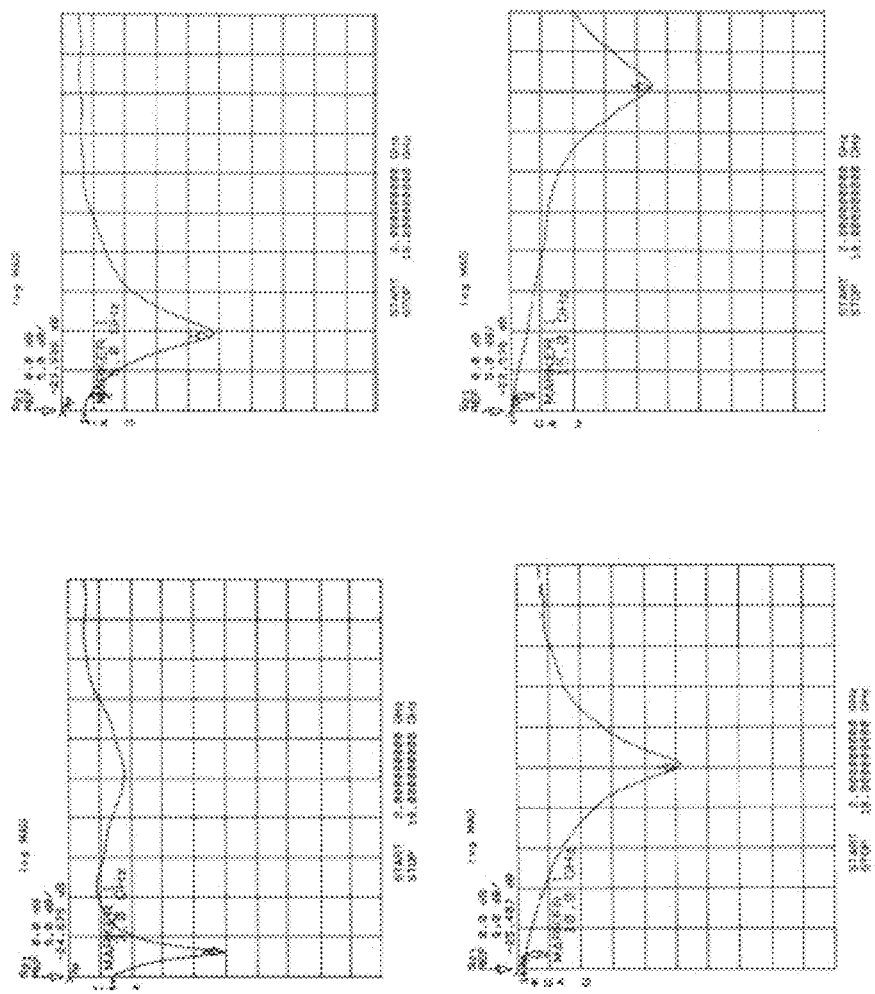
FIG. 10 illustrates typical reflectivity curves of several different radiation-absorbing panel materials.

Typical reflectivity curves of several different radiation-absorbing panel materials are illustrated in FIG. 10. Here, the reflectivity curves correspond to radiation-absorbing panel materials tuned to 3 GHz, 5 GHz, 10 GHz, and 15 GHz.

In some embodiments, the laminate curtain 900 will include a single radiation-absorbing panel 902 that is designed to absorb electromagnetic radiation of a specified frequency. In such embodiments, if an end user wishes to absorb a different frequency, then the end user will have to replace the laminate curtain 900.

In other embodiments, the laminate curtain 900 will include multiple radiation-absorbing panels. In such embodiments, each radiation-absorbing panel can be tuned to a different frequency. For example, a laminate curtain 900 may include radiation-absorbing panels corresponding to 97 GHz, 85 GHz, etc. Performance of a radiation-absorbing panel is generally not tight at higher frequencies. Thus, the higher the frequency, the wider the tuning range can be. For example, a radiation-absorbing panel tuned to 96 GHz may also tune out 95 GHz and 97 GHz signals. As another example, a radiation-absorbing panel tuned to 5 GHz may also tune out 4 GHz signals, but might allow 3 GHz signals to pass through.

Because the radiation-absorbing panel 902 does not need to be electrically powered or grounded, the radiation-absorbing panel 902 can be secured to an adjacent layer with a non-conductive adhesive film. For example, a pressure-sensitive adhesive may be all that is needed to secure the radiation-absorbing panel 902 to the conductive elastomer panel 904 or another radiation-absorbing panel. The order of the layers within the laminate curtain 900 can vary, so long as the conductive elastomer panel 904 remains electrically coupled to the support frame 908.

The layers of the laminate curtain 900 may also be laminated together under sufficient pressure to activate the adhesive layer(s), and then allowed sufficient time to cure. For example, pressure may be applied to a stack of multiple radiation-absorbing panels that are secured to one another with a pressure-sensitive adhesive. As another example, the laminate curtain 900 may be exposed to a curing assembly for a specified duration to ensure that the conductive elastomer panel 904 securely bonds to the support frame 908.

Embodiments of the laminate curtain 900 may include some or all of these layers, as well as other layers not shown here. For example, some embodiments of the laminate curtain 900 only include the conductive elastomer panel 904 and the support frame 906.

Figure 11:
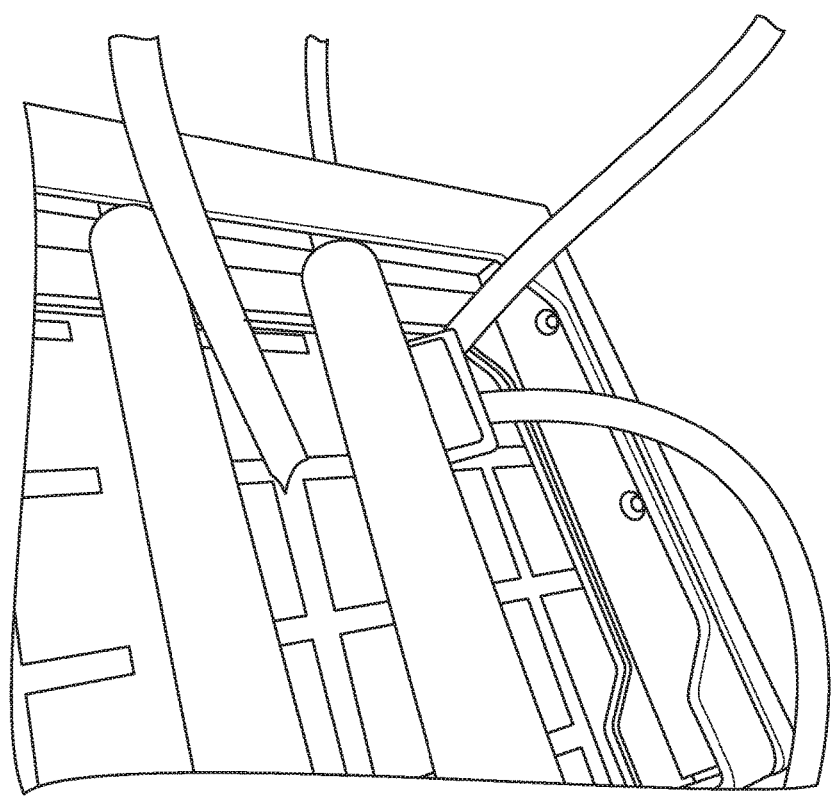
FIG. 11 illustrates how cables connected to the interface surface of an electronic appliance can be routed through perforations in a laminate curtain.

FIG. 11 illustrates how cables connected to the interface surface of an electronic appliance can be routed through perforations in a laminate curtain. Here, for example, orthogonal slots have been laser cut into the laminate curtain. These slots allow cables of different sizes to be slid through the laminate curtain and neatly dressed into a vertical channel running alongside the electronic appliance.

FIG. 12 illustrates how the slots in a laminate curtain can form a series of flaps, which seal as much as possible to ensure maximum capture of electromagnetic radiation leaking from the electronic appliance. A cable can be easily maneuvered along the slots so that the opening created by the cable can be substantially sealed. The slots can accommodate cables of varying diameters. For example, a single laminate curtain may accommodate the passing of both large and small cables.

As noted above, in some embodiments the laminate curtain includes one or more stiffener components that add stiffness to the laminate curtain. The stiffener component(s) may provide sufficient tension to close each slot after a cable has been slid through the laminate curtain. This may be particularly useful when an end user needs to add a new cable behind previously-installed cables but wants to avoid removing all previously-installed cables to dress in the new cable.

Some embodiments of the laminate curtain can also be modified in the field prior to installation within a mounting bracket. For example, an end user may wish to create a perforation by removing material along an existing slot, lengthen an existing slot, or create an entirely new opening in the laminate curtain to accommodate a large diameter cable. If the large cable is removed or moved at a later time, then the laminate curtain can be replaced with an unmodified laminate curtain. Similarly, if a laminate curtain becomes damaged, then the laminate curtain can be replaced in the field.

FIG. 13 depicts a flow diagram of a process 1400 for manufacturing a laminate curtain able to suppress electromagnetic radiation leaking from the chassis of an electronic appliance. Initially, a manufacturer acquires a conductive elastomer panel that is configured to absorb spurious electromagnetic radiation generated by the electronic appliance (step 1301). The conductive elastomer panel is generally designed to perform over a large range of electromagnetic radiation frequencies. For example, the conductive elastomer panel may be designed to absorb electromagnetic radiation frequencies ranging from 50-100 GHz, 100-200 GHz, etc.

The conductive elastomer panel can then be secured to a support frame (step 1402). For example, the conductive elastomer panel and the support frame may be secured together via a conductive adhesive film. Together, the conductive elastomer panel and the support frame form an electrically-conductive attachment that can be secured to the electronic appliance.

The conductive adhesive film may extend across an entire side of the conductive elastomer panel. However, the support frame may only make contact with a relatively small percentage of the conductive adhesive film. Therefore, in some embodiments one or more stiffener components are affixed to the exposed portion of the conductive adhesive film (step 1303). Generally, the stiffener component(s) are comprised of a non-conductive material, such as plastic, glass, rubber, etc. The stiffener component(s) also add stiffness to the laminate curtain in addition to covering exposed portions of the conductive adhesive film.

One or more radiation-absorbing panels may also be affixed to the conductive elastomer panel (step 1404). Unlike the conductive elastomer panel, the radiation-absorbing panel(s) are typically engineered to perform optimally at a relatively narrow range of electromagnetic frequencies. For example, the laminate curtain may include radiation-absorbing panels designed to absorb electromagnetic radiation corresponding to a frequency of 150 GHz, 125 GHz, 110 GHz, 97 GHz, 85 GHz, etc.

The laminate curtain can then be exposed to a curing assembly for a specified duration (step 1305). The curing assembly can include a light source (e.g., an ultraviolet light source) and/or a heat source (e.g., a heat lamp). The laminate curtain may be exposed to the curing assembly for a specified duration to ensure that the adhesive layer(s) in the laminate curtain have solidified. Additionally or alternatively, pressure may also be applied to the laminate curtain. An application of pressure may be necessary when the laminate curtain includes at least one pressure-sensitive adhesive layer. For example, pressure may be applied to a stack of multiple radiation-absorbing panels that are secured to one another via pressure-sensitive adhesive layers.

In some embodiments, the laminate curtain is cut to create one or more openings through which a cable can be guided (step 1406). For example, a laser cutter may create a series of orthogonal slots that allow cables of different diameters to pass through. Perforations of different sizes, shapes, and/or patterns may be cut into a laminate curtain based on which cable(s) are expected to be guided through the laminate curtain. Alternatively, a laminate curtain may be left unmodified. In such embodiments, an end user may be expected to manually create opening(s) in the laminate curtain.

Unless contrary to physical possibility, it is envisioned that the steps described above may be performed in various sequences and combinations. For example, the laminate curtain may be cured each time a new layer is added. Other steps could also be included in some embodiments.

Processing System

Figure 14:
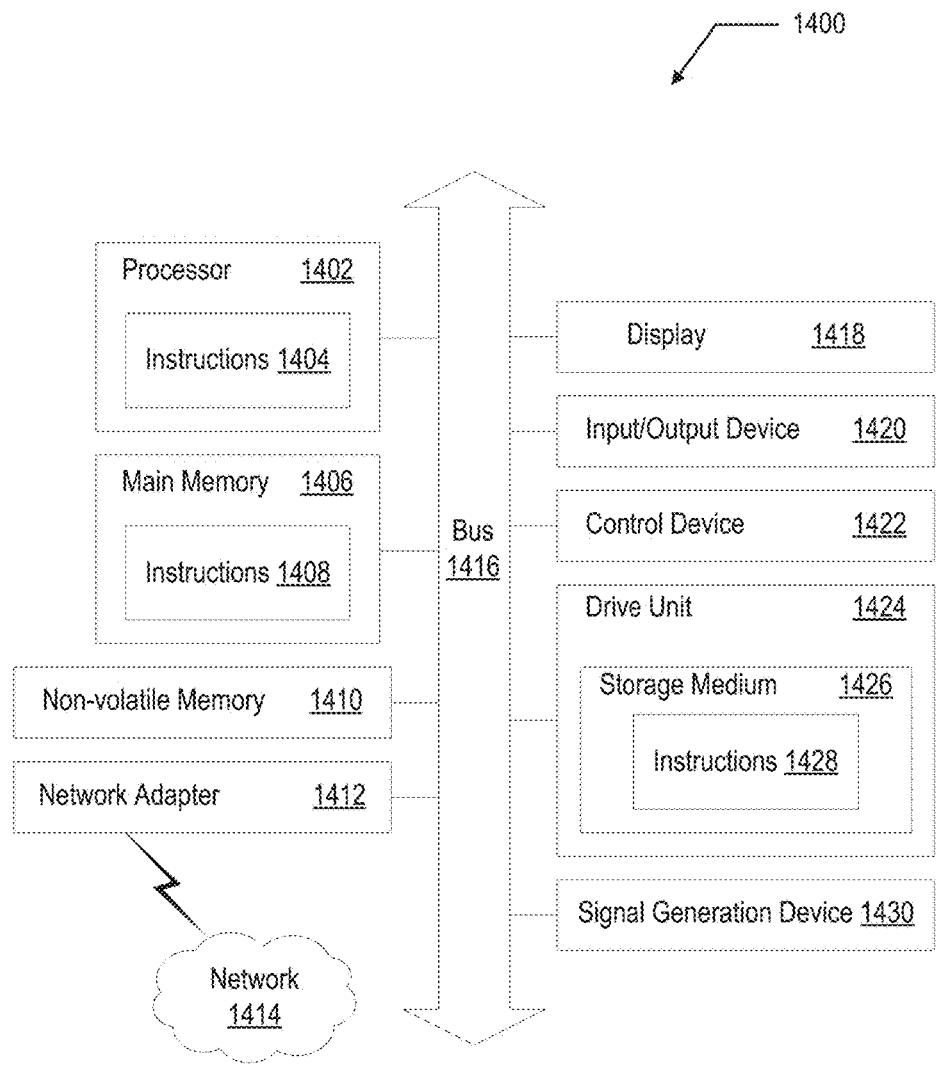
FIG. 14 is a block diagram illustrating an example of a processing system in which at least some operations described herein can be implemented.

FIG. 14 is a block diagram illustrating an example of a processing system 1400 in which at least some operations described herein can be implemented. For example, the processing system 1400 may share a computer architecture with an electronic appliance to which one or more laminate curtains are connected (e.g., electronic appliance 100 of FIG. 1). As another example, the processing system 1400 may be responsible for implementing certain steps of a process for manufacturing laminate curtains.

The process system 1400 may include one or more processors 1402, main memory 1406, non-volatile memory 1410, network adapter 1412 (e.g., network interfaces), display 1418, input/output devices 1420, control device 1422 (e.g., keyboard and pointing devices), drive unit 1424 including a storage medium 1426, and signal generation device 1430 that are communicatively connected to a bus 1416. The bus 1416 is illustrated as an abstraction that represents any one or more separate physical buses, point to point connections, or both connected by appropriate bridges, adapters, or controllers. The bus 1416, therefore, can include, for example, a system bus, a Peripheral Component Interconnect (PCI) bus or PCI-Express bus, a HyperTransport or industry standard architecture (ISA) bus, a small computer system interface (SCSI) bus, a universal serial bus (USB), IIC (I2C) bus, or an Institute of Electrical and Electronics Engineers (IEEE) standard 1394 bus, also called "Firewire." A bus may also be responsible for relaying data packets (e.g., via full or half duplex wires) between components of a network appliance, such as a switching engine, network port(s), tool port(s), etc.

In various embodiments, the processing system 1400 operates as a standalone device, although the processing system 1400 may be connected (e.g., wired or wirelessly) to other devices. For example, the processing system 1400 may include a terminal that is coupled directly to an electronic appliance. As another example, the processing system 1400 may be wirelessly coupled to the electronic appliance.

In various embodiments, the processing system 1400 may be a server computer, a client computer, a personal computer (PC), a user device, a tablet PC, a laptop computer, a personal digital assistant (PDA), a cellular telephone, an iPhone, an iPad, a Blackberry, a processor, a telephone, a web appliance, a network router, switch or bridge, a console, a hand-held console, a (hand-held) gaming device, a music player, any portable, mobile, hand-held device, or any machine capable of executing a set of instructions (sequential or otherwise) that specify actions to be taken by the processing system 1400.

While the main memory 1406, non-volatile memory 1410, and storage medium 1426 (also called a "machine-readable medium) are shown to be a single medium, the term "machine-readable medium" and "storage medium" should be taken to include a single medium or multiple media (e.g., a centralized or distributed database, and/or associated caches and servers) that store one or more sets of instructions 1428. The term "machine-readable medium" and "storage medium" shall also be taken to include any medium that is capable of storing, encoding, or carrying a set of instructions for execution by the processing system 1400 and that cause the processing system 1400 to perform any one or more of the methodologies of the presently disclosed embodiments.

In general, the routines that are executed to implement the technology may be implemented as part of an operating system or a specific application, component, program, object, module, or sequence of instructions (collectively referred to as "computer programs"). The computer programs typically comprise one or more instructions (e.g., instructions 1404, 1408, 1428) set at various times in various memory and storage devices in a computer, and that, when read and executed by one or more processing units or processors 1402, cause the processing system 1400 to perform operations to execute elements involving the various aspects of the disclosure.

Moreover, while embodiments have been described in the context of fully functioning computers and computer systems, those skilled in the art will appreciate that the various embodiments are capable of being distributed as a program product in a variety of forms, and that the disclosure applies equally regardless of the particular type of machine or computer-readable media used to actually effect the distribution.

Further examples of machine-readable storage media, machine-readable media, or computer-readable (storage) media include recordable type media such as volatile and non-volatile memory devices 1410, floppy and other removable disks, hard disk drives, optical disks (e.g., Compact Disk Read-Only Memory (CD ROMS), Digital Versatile Disks (DVDs)), and transmission type media such as digital and analog communication links.

The network adapter 1412 enables the processing system 1400 to mediate data in a network 1414 with an entity that is external to the processing system 1400, such as a network appliance, through any known and/or convenient communications protocol supported by the processing system 1400 and the external entity. The network adapter 1412 can include one or more of a network adaptor card, a wireless network interface card, a router, an access point, a wireless router, a switch, a multilayer switch, a protocol converter, a gateway, a bridge, bridge router, a hub, a digital media receiver, and/or a repeater.

The network adapter 1412 can include a firewall which can, in some embodiments, govern and/or manage permission to access/proxy data in a computer network, and track varying levels of trust between different machines and/or applications. The firewall can be any number of modules having any combination of hardware and/or software components able to enforce a predetermined set of access rights between a particular set of machines and applications, machines and machines, and/or applications and applications, for example, to regulate the flow of traffic and resource sharing between these varying entities. The firewall may additionally manage and/or have access to an access control list which details permissions including for example, the access and operation rights of an object by an individual, a machine, and/or an application, and the circumstances under which the permission rights stand.

Other network security functions can be performed or included in the functions of the firewall, including intrusion prevention, intrusion detection, next-generation firewall, personal firewall, etc.

As indicated above, the techniques introduced here implemented by, for example, programmable circuitry (e.g., one or more microprocessors), programmed with software and/or firmware, entirely in special-purpose hardwired (i.e., non-programmable) circuitry, or in a combination or such forms. Special-purpose circuitry can be in the form of, for example, one or more application-specific integrated circuits (ASICs), programmable logic devices (PLDs), field-programmable gate arrays (FPGAs), etc.

Note that any of the embodiments described above can be combined with another embodiment, except to the extent that it may be stated otherwise above or to the extent that any such embodiments might be mutually exclusive in function and/or structure.

Although the present invention has been described with reference to specific exemplary embodiments, it will be recognized that the invention is not limited to the embodiments described, but can be practiced with modification and alteration within the spirit and scope of the appended claims. Accordingly, the specification and drawings are to be regarded in an illustrative sense rather than a restrictive sense.

What is claimed is:

1. An electromagnetic interference (EMI) shielding system for an electronic appliance, the EMI shielding system comprising:
   a pair of brackets connected to opposite sides of an electronic appliance chassis; and
   a pair of laminate curtain assemblies, each removably connected to a separate bracket of the pair of brackets, wherein each laminate curtain assembly of the pair of laminate curtain assemblies includes
      a laminate curtain configured to absorb electromagnetic radiation leaking from an interconnect surface of the electronic appliance chassis that is orthogonal to the opposite sides of the electronic appliance chassis, and
      a mounting frame within which the laminate curtain is mounted.

2. The EMI shielding system of claim 1, further comprising:
   an enclosure mounted to the pair of laminate curtain assemblies,
      wherein the enclosure includes a top panel, a bottom panel, and a front panel connecting the top panel to the bottom panel.

3. The EMI shielding system of claim 2, wherein the enclosure and the pair of laminate curtain assemblies together form a substantially-sealed chamber adjacent to the interconnect surface of the electronic appliance chassis.

4. The EMI shielding system of claim 3, wherein a cable connected to the interconnect surface of the electronic appliance chassis is routed from the substantially-sealed chamber to an external environment through a perforation in the laminate curtain of a specified laminate curtain assembly.

5. The EMI shielding system of claim 2, further comprising:
an air filter configured to filter air entering the electronic appliance chassis.

6. The EMI shielding system of claim 5, wherein the air filter is disposed within the top panel, the bottom panel, or the front panel of the enclosure.

7. The EMI shielding system of claim 5, further comprising:
an EMI suppression panel that at least partially overlays the air filter.

8. The EMI shielding system of claim 1, wherein the laminate curtain of each laminate curtain assembly is removable from the corresponding mounting frame.

9. The EMI shielding system of claim 1, wherein the laminate curtain is comprised of:
a conductive elastomer panel designed to absorb electromagnetic radiation corresponding to a specified frequency range;
a conductive support frame; and
a conductive adhesive layer that electrically connects the conductive elastomer panel to the conductive support frame.

10. The EMI shielding system of claim 9, wherein the laminate curtain is further comprised of:
a stiffener component affixed to the conductive adhesive layer.

11. The EMI shielding system of claim 1, wherein the laminate curtain includes a plurality of slots through which cables connected to the interconnect surface of the electronic appliance chassis can be routed.

12. A laminate curtain comprising:
a conductive elastomer panel configured to absorb electromagnetic radiation leaking from an electronic appliance chassis;
a conductive support frame configured to be connected to the electronic appliance chassis; and
a conductive adhesive film that secures the conductive elastomer panel to the conductive support frame;
wherein the conductive support frame is configured to shunt at least a portion of the electromagnetic radiation absorbed by the conductive elastomer panel to the electronic appliance chassis, the at least a portion of the electromagnetic radiation flowing from the conductive elastomer panel to the conductive support frame via the conductive adhesive film.

13. The laminate curtain of claim 12, further comprising:
a plurality of stiffener components affixed to the conductive adhesive film.

14. The laminate curtain of claim 12, further comprising:
a radiation-absorbing panel configured to absorb electromagnetic radiation of a specified frequency; and
an adhesive film that secures the radiation-absorbing panel to the conductive elastomer panel.

15. The laminate curtain of claim 14, wherein the adhesive film disposed between the radiation-absorbing panel and the conductive elastomer panel is not electrically conductive.

16. The laminate curtain of claim 14, wherein the radiation-absorbing panel is one of a plurality of radiation-absorbing panels included in the laminate curtain.

17. The laminate curtain of claim 16, wherein each radiation-absorbing panel of the plurality of radiation-absorbing panels is designed to absorb electromagnetic radiation of a different frequency.

* * * * *